United States Patent [19]
Kato

[11] Patent Number: 5,978,308
[45] Date of Patent: Nov. 2, 1999

[54] SINGLE-CHIP MEMORY SYSTEM HAVING A DECODER FOR PULSE WORD LINE METHOD

[75] Inventor: Yoshiyuki Kato, Tokyo, Japan

[73] Assignee: NEC Corporation, Tokyo, Japan

[21] Appl. No.: 08/803,249

[22] Filed: Feb. 20, 1997

[30] Foreign Application Priority Data

Feb. 28, 1996 [JP] Japan .................................. 8-041392

[51] Int. Cl.$^6$ ....................................................... G11C 8/00
[52] U.S. Cl. ............................... 365/230.06; 365/189.11; 365/226; 711/150
[58] Field of Search ............................... 365/208, 230.06, 365/233, 233.5, 230.01, 189.11, 94, 200; 326/98, 108

[56] References Cited

U.S. PATENT DOCUMENTS

| | | | |
|---|---|---|---|
| 5,507,024 | 4/1996 | Richards, Jr. ............................ | 455/260 |
| 5,577,003 | 11/1996 | Fuji ...................................... | 365/230.01 |
| 5,610,872 | 3/1997 | Toda ..................................... | 365/230.06 |
| 5,612,917 | 3/1997 | Kozaru et al. .......................... | 365/200 |
| 5,666,324 | 9/1997 | Kosugi et al. .......................... | 365/233 |
| 5,673,225 | 9/1997 | Jeong et al. ........................... | 365/189.11 |
| 5,768,203 | 6/1998 | Fuji ....................................... | 365/208 |

*Primary Examiner*—John W. Cabeca
*Assistant Examiner*—Fred F. Tzeng
*Attorney, Agent, or Firm*—McGinn & Gibb, P.C.

[57] ABSTRACT

To avoid selecting multiple word lines, a memory system including a pulse word line method capability includes a decoder for activating one word line when a clock signal has an active level and for forcibly inactivating all word lines when the clock signal has an inactive level.

22 Claims, 8 Drawing Sheets

SINGLE-CHIP MEMORY SYSTEM HAVING A DECODER FOR PULSE WORD LINE METHOD

BACKGROUND OF THE INVENTION

The present invention generally relates to a memory system having a "pulse word line method" capability, and more particularly to a memory system including a decoder for activating a word line according to the pulse word line method.

DESCRIPTION OF THE RELATED ART

Memory systems are needed to access data faster. Therefore, memory systems, typically having a cache and a main memory array comprising dynamic random access memories (DRAMs), are used. The cache comprises static random access memories (SRAMs) because an access speed of an SRAM is faster than that of a DRAM. However, an SRAM is more expensive than a DRAM, and therefore a main memory array typically comprises DRAMs, and an SRAM is used only for the cache for assisting the main memory array.

However, power consumption of the memory systems should be reduced as much as possible. Therefore, a pulse word line method is used for accessing the SRAM.

FIG. 1 shows a conventional memory system including a single-chip memory device 50 and an external central processing unit (CPU) 51. The memory device includes an array of SRAM cells 52 and an array of DRAM cells (not shown in FIG. 1). The array 52 has a plurality of word lines, a plurality of bit lines and a plurality of SRAM cells. The CPU 51 processes instructions by using data from the memory device.

The memory device 50 also includes input terminals (unreferenced) for receiving a row address strobe (RAS) signal, a column address strobe (CAS) signal, a write enable (WE) signal, a clock (CLK) signal and address signals having row address signals and column address signals.

A row decoder 53 activates one word line of the word lines in response to row address signals. The row decoder is activated when the CPU changes the RAS signal to an active high level (e.g., "1") from an inactive low level (e.g., "0").

A column decoder 55 activates bit lines in response to column address signals. The column decoder is activated when the CPU changes the CAS signal to an active high level (e.g., "1") from an inactive low level (e.g., "0").

The memory device 50 also includes I/O terminals (unreferenced) for inputting or outputting data. An I/O buffer 56 transfers data from the I/O terminals to a sense amplifier 54 when the CPU changes the WE signal to an active high level (e.g., "1") from an inactive low level (e.g., "0"), and transfers data from the sense amplifier 54 to the I/O terminals when the CPU changes the WE signal to an inactive level from an active level. The sense amplifier 54 amplifies data from the SRAM cell.

A delay circuit 57 receives the CLK signal and outputs a delayed clock 1 (CLK1) signal. A delay circuit 58 also receives the CLK signal and outputs a delayed pulse (PULSE) signal.

FIG. 2 illustrates the row decoder 53 in detail, which includes an address signal receiving circuit 1, a plurality of register circuits 2a and a word line activating circuit 3a. In this example, the array of SRAM cells 52 has four word lines WL0–WL3 and the row decoder 53 receives four row address signals A0–A3 for easy understanding.

Exemplary relationships between the levels of the address signals A0–A3, outputs of register circuits X0–X3, and the word lines WL0–WL3 to be selected are as shown in the following Table 1.

TABLE 1

| Address Signals | | | | Register Circuit Outputs | | | | Selected Word lines |
|---|---|---|---|---|---|---|---|---|
| A0 | A1 | A2 | A3 | X0 | X1 | X2 | X3 | |
| H | H | H | H | H | L | H | L | WL0 |
| L | H | L | H | L | H | L | H | WL3 |
| L | H | H | H | L | H | H | L | WL1 |
| H | H | L | H | H | L | L | H | WL2 |

The address signal receiving circuit 1 includes AND circuit D1 for receiving the address signals A0 and A1, AND circuit D2 for receiving the address signal A1 and an inverted address signal A0, AND circuit D3 for receiving the address signals A2 and A3, and AND circuit D4 for receiving the address signal A3 and an inverted address signal A2.

Each register circuit 2a includes a P-type metal oxide semiconductor (MOS) transistor TR1 having a source-drain path between node N1 and node N2, an inverter I1 for inverting a signal of node N2 and outputting the inverted signal to node N3, an inverter I2 for inverting a signal of node N3, an N-type MOS transistor TR2 having a source-drain path between node N2 and an output of the inverter I2, an N-type MOS transistor TR3 having a source-drain path between node N3 and node N4, an inverter I3 for inverting a signal of node N4 and outputting the inverted signal to node N5, an inverter I4 for inverting a signal of node N5, and a P-type MOS transistor TR4 having a source-drain path between node N4 and an output of the inverter I4. Each gate of MOS transistors TR1, TR2, TR3 and TR4 receives clock signal CLK1.

The word line activating circuit 3a includes AND circuit WD1 for receiving the signals X0, X2 and the PULSE signal, AND circuit WD2 for receiving the signals X1, X2 and the PULSE signal, AND circuit WD3 for receiving the signals X0, X3 and the PULSE signal, and AND circuit WD4 for receiving the signals X1, X3 and the PULSE signal. Each of AND circuits WD1–WD4 activates a corresponding word line when all signals received by the AND circuit have an active level (e.g., "1"), and inactivates a corresponding word line when at least one signal of the signals received by the AND circuit has an inactive level (e.g., "0").

FIG. 3 is a timing chart for explaining a normal operation of the circuit of FIG. 2. At timing T0, a bus cycle CYCLE2 starts, and a CLK1 signal changes to an active level (e.g., "1") from an inactive level (e.g., "0") in synchronism with the CYCLE2. In this example, each of the signals X0 and X2 has an inactive level (e.g., "0"), and each of the signals X1 and X3 has an active level (e.g., "1") at a bus cycle CYCLE1.

Thereafter, for example, each of the signals X0 and X2 becomes active, and each of the signals X1 and X3 becomes inactive at a bus cycle CYCLE2.

At this time, although each of register circuits 2a has the same construction, the timing of the signals X0–X3 are different from each other. The reasons for the timing difference are that the area where the circuits 2a are positioned is different from each other on the single-chip memory system 50, and that each of the circuits 2a has a different parasitic resistor and a different parasitic capacitor from each other.

However, for an easy explanation, the signals X0 and X1 have the same timing T1, and the signals X2 and X3 have the same timing T2 as shown in FIG. 3.

In FIG. 3, the PULSE signal is changed to an active level (e.g., "1") from an inactive level (e.g., "0") at the timing T3 after the timings T1 and T2. Therefore, only one word line WL0 among word lines WL0–WL3 is changed to an active level (e.g., "1") from an inactive level (e.g., "0").

Moreover, all word lines WL0–WL3 are changed to an inactive level from an active level when the PULSE signal is changed to an inactive level from an active level. This is a so-called "pulse word line method".

However, the timings T1 and T2 may be changed (e.g., opposite) depending on the circuit design because they depend on a parasitic resistance and a parasitic capacitance. Therefore, it is possible for timing to occur as shown in FIG. 4. In FIG. 4, the timing T2 occurs after the timing T3. Therefore, two word lines WL0 and WL2 are selected erroneously during a bus cycle CYCLE2. This is a so-called "multiple word line selection".

In such a case, either the position of each apparatus on the chip 50 must be redesigned, or the delay time of the delay circuit 58 must be changed. Thus, problems arise since redesigning the chip 50 is costly. Further, increasing the delay time of the PULSE signal by changing the delay time of the delay circuit slows the access time since the time to activate a word line increases (e.g., shifts later).

SUMMARY OF THE INVENTION

In view of the foregoing problems of the conventional memory system, it is therefore an object of the present invention to provide an improved memory system having a decoder for activating a word line according to the pulse word line method.

It is another object of the present invention to provide an improved decoder for activating a word line according to the pulse word line method.

In a first aspect, a memory system according to the present invention includes an array of memory cells including a plurality of word lines, a terminal for receiving a clock signal and an address signal, and a decoder for receiving the address signal and for generating a decoded signal, and including a register circuit for storing the decoded signal, and for outputting the decoded signal in response to an active level of the clock signal and for stopping outputting of the decoded signal in response to an inactive level of the clock signal, and an activating circuit for activating a word line of the word lines based on an output of the register circuit.

With the unique and unobvious structure of the present invention, the decoded signals outputted to the activating circuit are terminated in response to an inactive level of the clock signal. Therefore, selecting an improper word line is prevented and the problems of the above-mentioned conventional memory system are prevented.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 5:
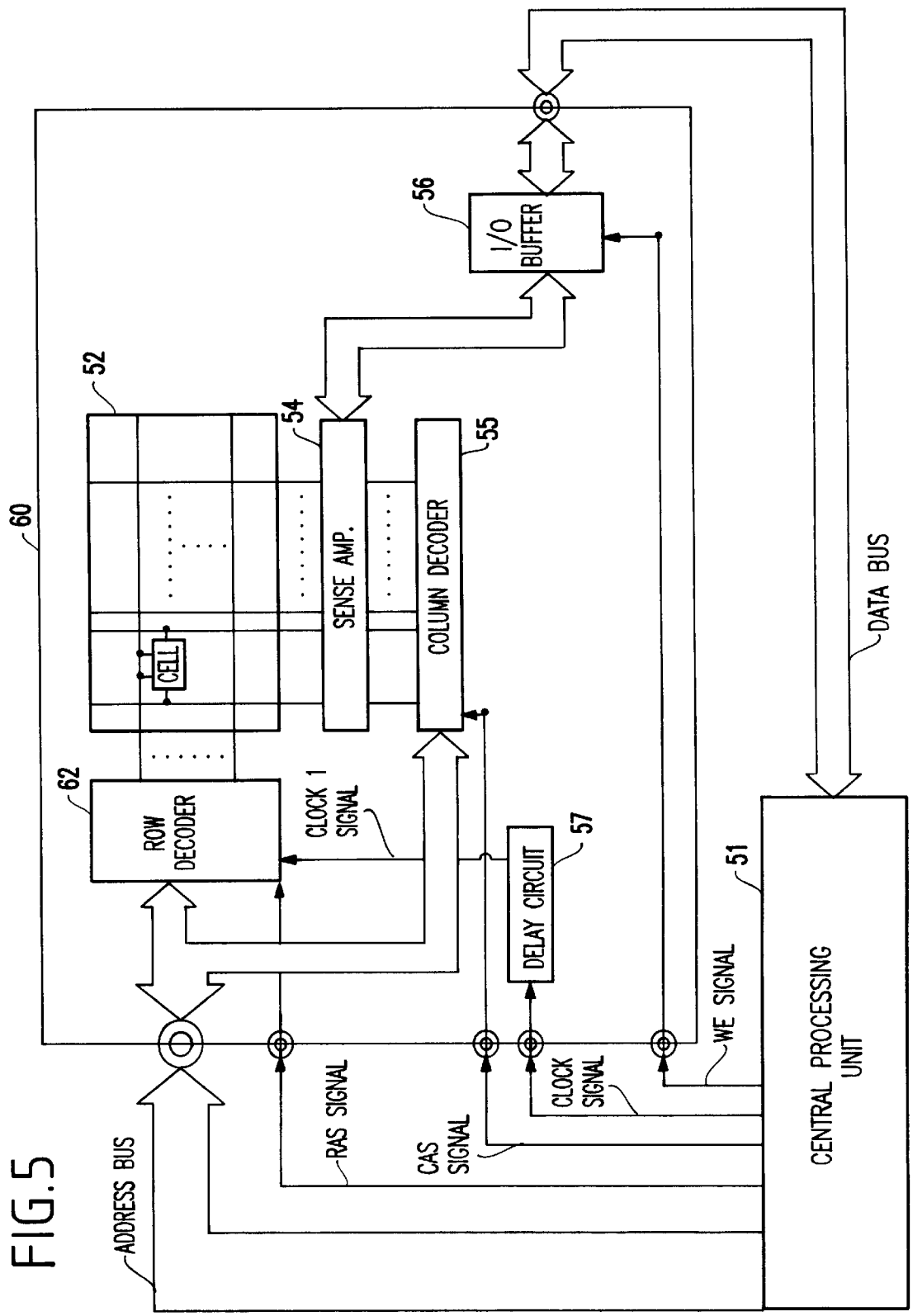
FIG. 5 is a diagram showing a memory system of a first embodiment according to the present invention.

Referring now to the drawings, and more particularly to FIG. 5, a single-chip semiconductor memory system 60 has a row decoder 62 according to a first embodiment of the present invention. The same parts in FIG. 5 as those in FIG. 1 are numbered with the same reference numerals as in FIG. 1 and for brevity explanations of these parts are omitted from the following description.

Figure 1:
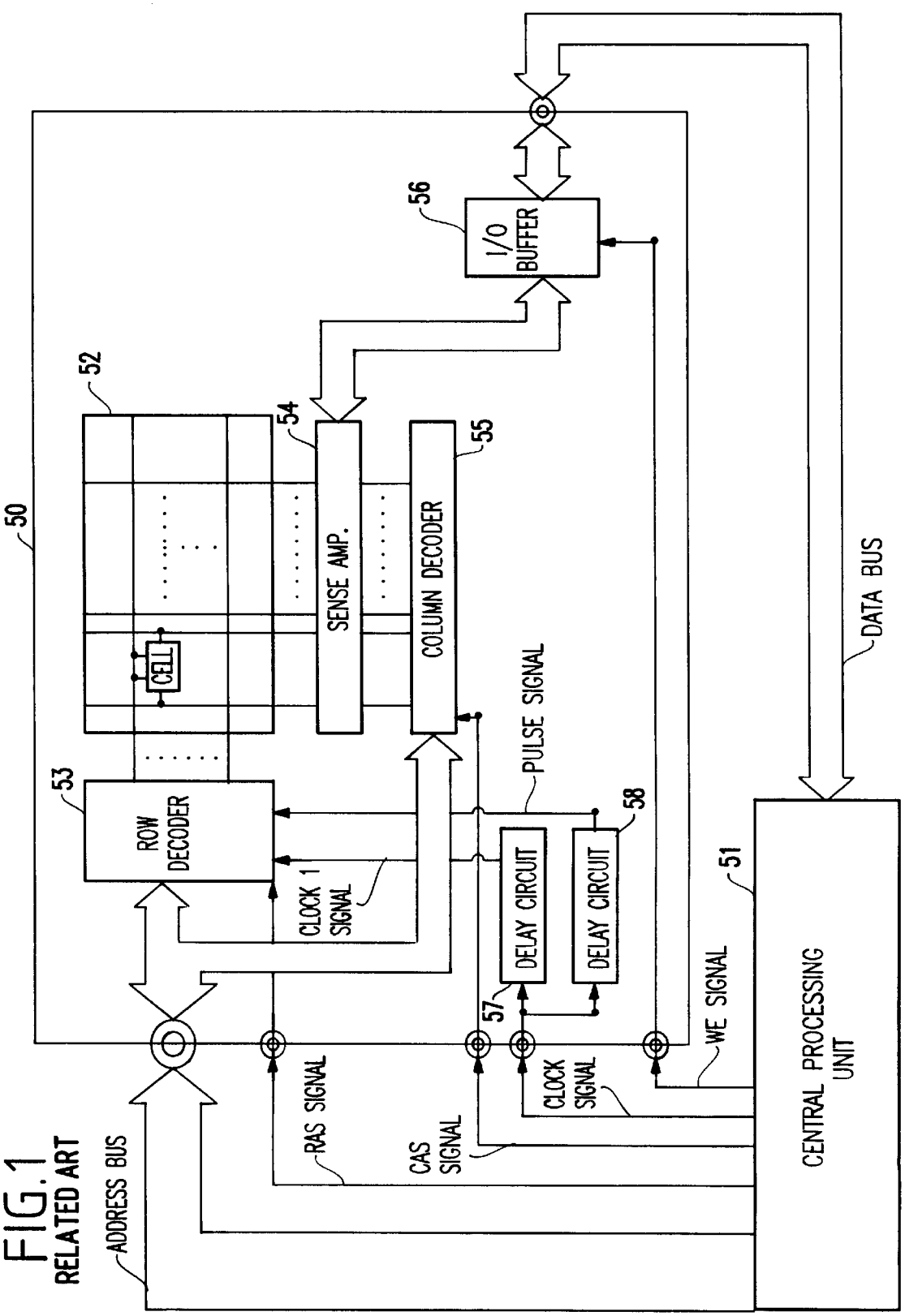
FIG. 1 is a diagram showing a conventional memory system.

As shown in FIG. 5, a single-chip semiconductor memory system 60 has no delay circuit 58 as in FIG. 1, and therefore row decoder 62 does not receive the PULSE signal in FIG. 1.

Figure 6:
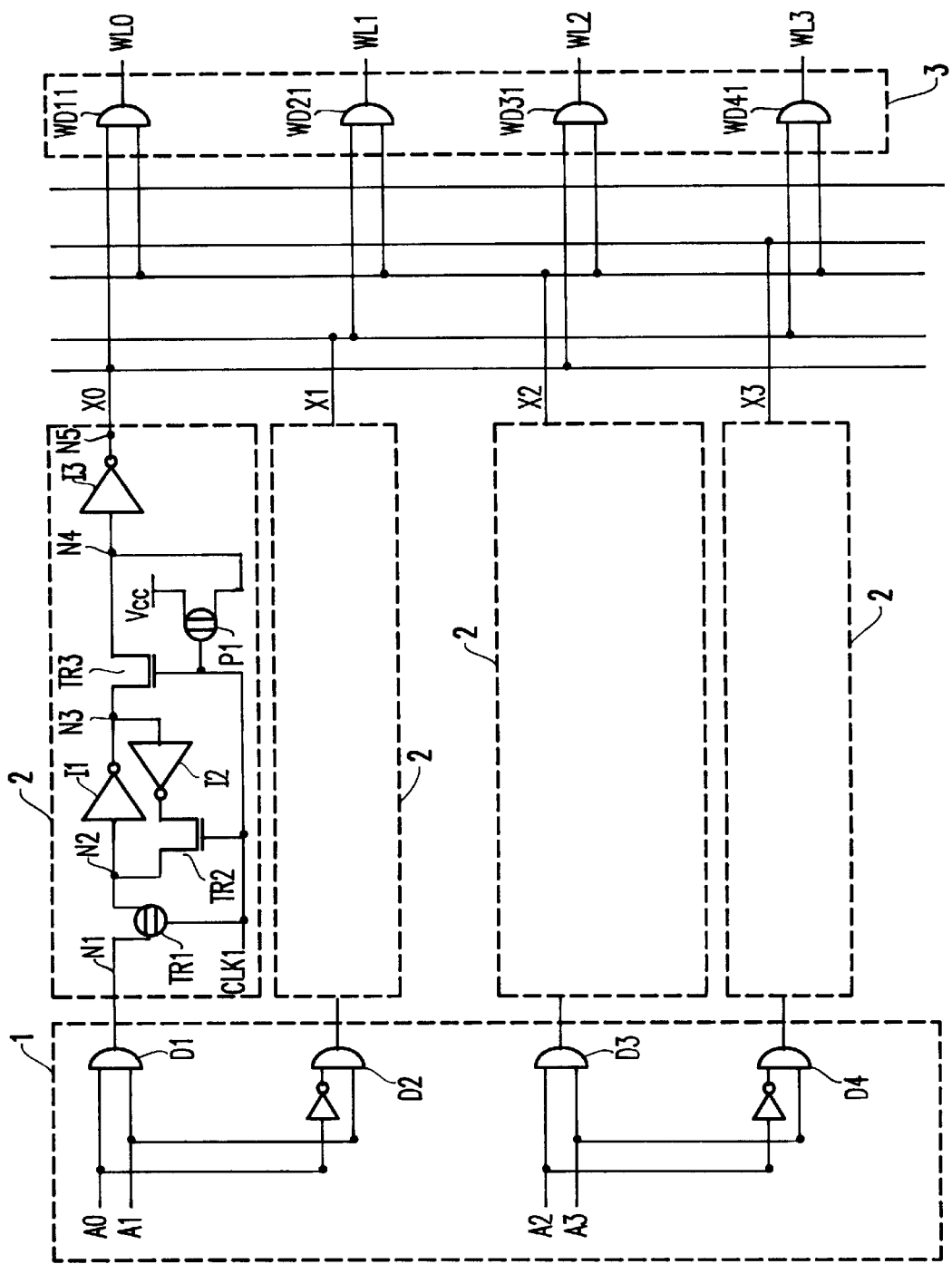
FIG. 6 is a circuit diagram showing a row decoder 62 of a first embodiment according to the present invention.

FIG. 6 illustrates the row decoder 62 in detail, which includes an address signal receiving circuit 1, a plurality of register circuits 2 and a word line activating circuit 3. While the array of SRAM cells 52 is shown with four word lines, the array typically has more than four word lines. However, for brevity and ease of understanding in the exemplary configuration, the array of SRAM cells 52 has four word lines WL0–WL3 and the row decoder 62 receives four row address signals A0–A3. Further, the relationships between the levels of the address signals A0–A3, outputs of register circuits X0–X3, and the word lines WL0–WL3 to be selected are as shown in the above Table 1.

The address signal receiving circuit 1 includes AND circuit D1 for receiving the address signals A0 and A1, AND circuit D2 for receiving the address signal A1 and an inverted address signal A0, AND circuit D3 for receiving the address signals A2 and A3, and AND circuit D4 for receiving the address signal A3 and an inverted address signal A2.

Each register circuit 2 includes a P-type MOS transistor TR1 having a source-drain path between node N1 and node N2, an inverter I1 for inverting a signal of node N2 and outputting the inverted signal to node N3, an inverter I2 for inverting a signal of node N3, an N-type MOS transistor TR2 having a source-drain path between node N2 and an output of the inverter I2, an N-type MOS transistor TR3 having a source-drain path between node N3 and node N4, an inverter I3 for inverting a signal of node N4 and outputting the inverted signal to node N5, and a P-type MOS transistor P1 having a source-drain path between node N4 and a reference voltage Vcc. The reference voltage Vcc has a fixed level (e.g., "1" or in a different configuration the reference voltage could be ground). Each gate of MOS transistors TR1, TR2, TR3 and P1 receives a delayed clock signal CLK1.

The word line activating circuit 3 includes AND circuit WD11 for receiving the signals X0 and X2, AND circuit WD21 for receiving the signals X1 and X2, AND circuit WD31 for receiving the signals X0 and X3, and AND circuit WD41 for receiving the signals X1 and X3. Each of AND circuits WD11–WD41 activates a corresponding word line when all signals received by the AND circuit have an active level (e.g., "1"), and inactivates a corresponding word line when at least one signal of the signals received by the AND circuit has an inactive level (e.g., "0").

Figure 7:
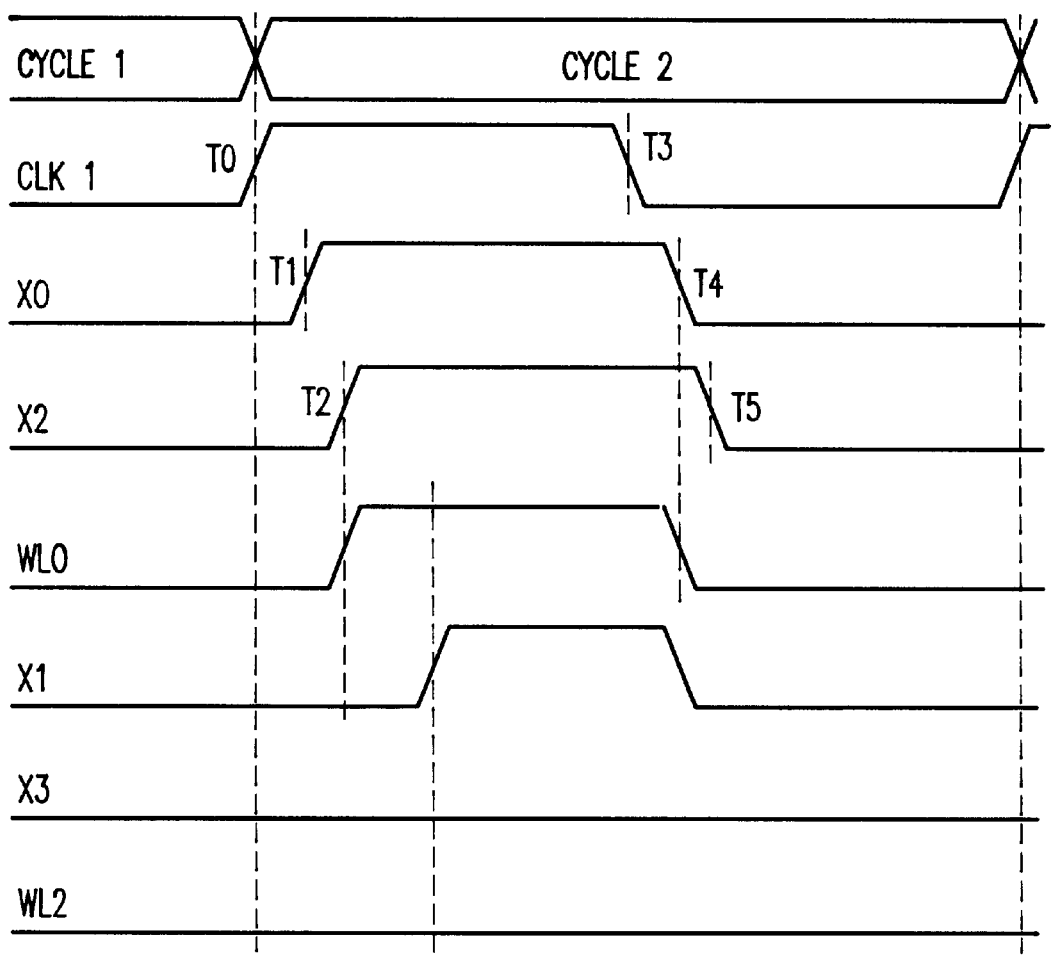
FIG. 7 is a timing chart showing timings of signals in the decoder 62 of FIG. 6.

FIG. 7 is a timing chart for explaining an operation of the circuit of FIG. 6. At timing T0, a bus cycle CYCLE2 starts, and CLK1 signal changes to an active level (e.g., "1") from an inactive level (e.g., "0") in synchronism with the CYCLE2.

Thereafter, for example, each of the signals X0 and X2 becomes active (e.g., "1"), and each of the signals X1 and X3 becomes inactive (e.g., "0") at a bus cycle CYCLE2.

At this time, P-type MOS transistors P1 are "OFF" because the CLK1 signal has an active level. Moreover, although each of register circuits 2a has the same construction, the timing of the signals X0 and X2 are different from each other. The reasons for the timing difference are that the area where the circuits 2 are positioned is different from each other on the single-chip memory system 60, and that each of the circuits 2 has a different parasitic resistance and a different parasitic capacitance from each other, as mentioned above.

The word line activating circuit 3 activates only one word line WL0 among word lines WL0–WL3 after the timing T2 because both signals X0 and X2 have an active level.

Thereafter, the CLK1 signal changes to an inactive level from an active level at the timing T3. Therefore, the signals X0 and X2 become an inactive level because the P-type MOS transistors are "ON" after the timing T3, and then the word line WL0 changes to an inactive level by the word line activating circuit 3 before an end of a bus cycle CYCLE2. These signal levels correspond to the pulse word line method.

In the first embodiment of the present invention, all signals X0–X3 become an inactive level forcibly before an end of a bus cycle CYCLE2, and then the word line activating circuit changes all word lines WL0–WL3 to an inactive level before the end of the bus cycle CYCLE2. Therefore, the "multiple word line selection" does not occur at a next bus cycle of the bus cycle CYCLE2, as in the conventional system.

Figure 2:
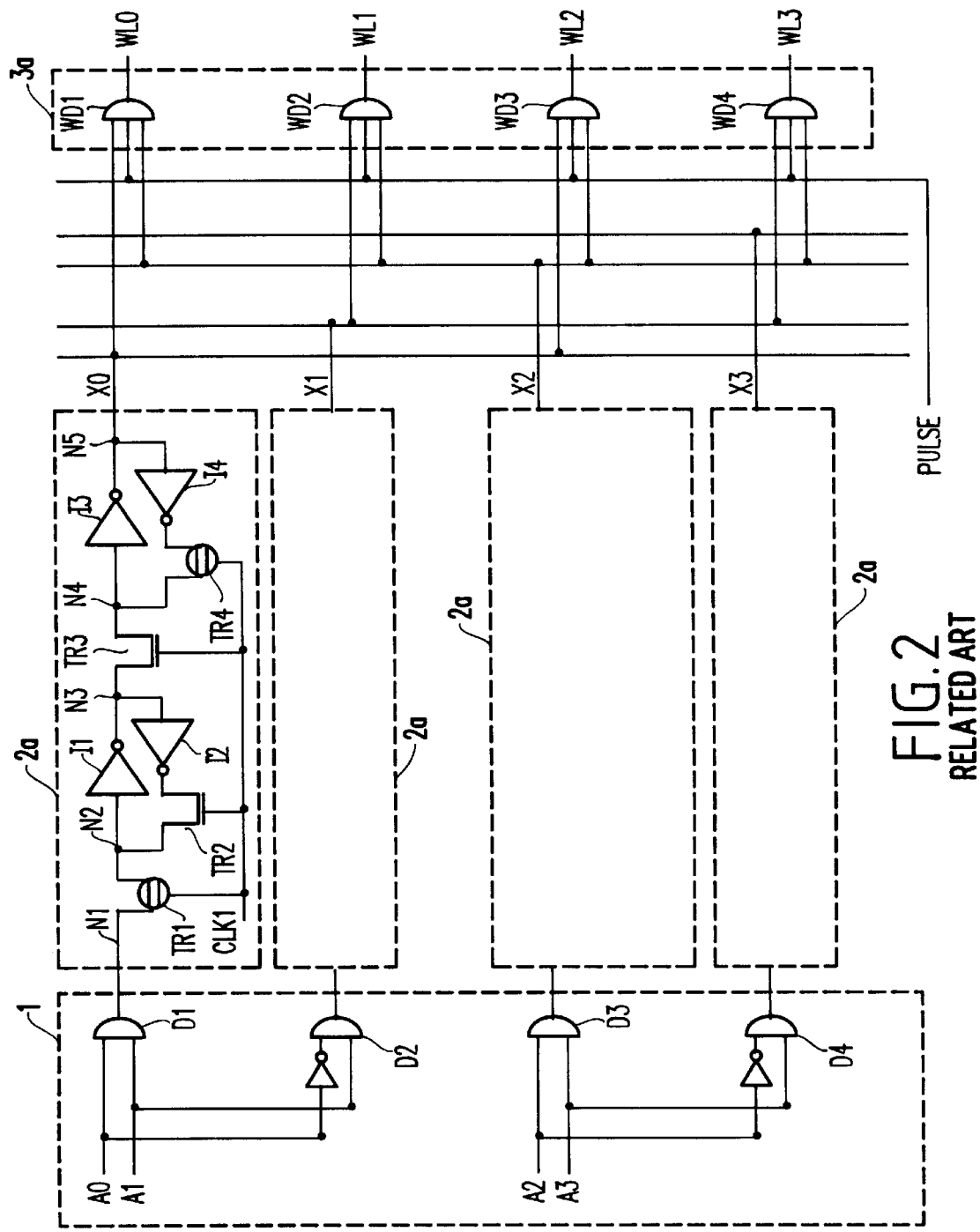
FIG. 2 is a circuit diagram showing a row decoder 53 in the memory system of FIG. 1.
Figure 3:
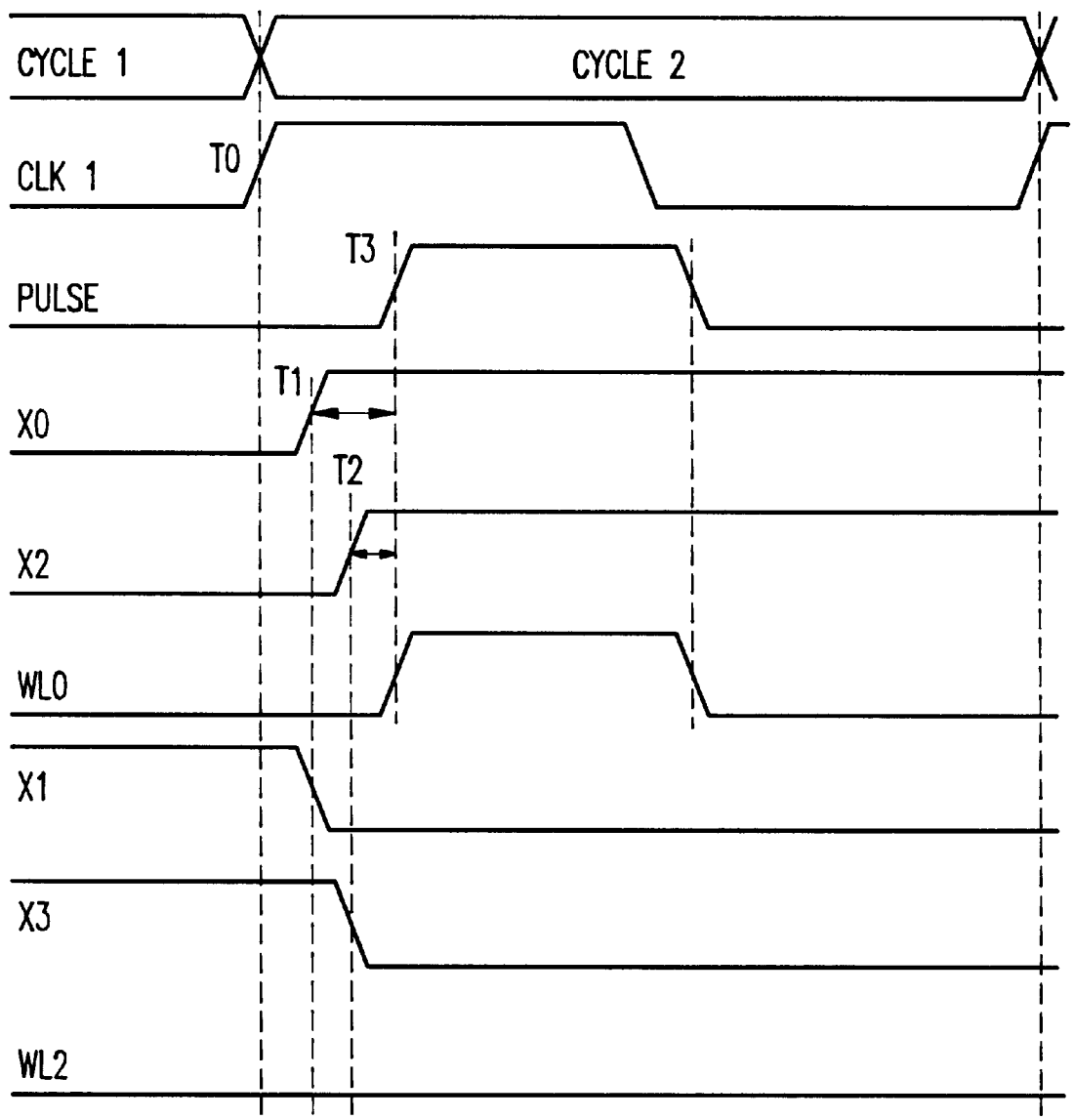
FIG. 3 is a timing chart showing normal timings of signals in the decoder 53 of FIG. 2.
Figure 4:
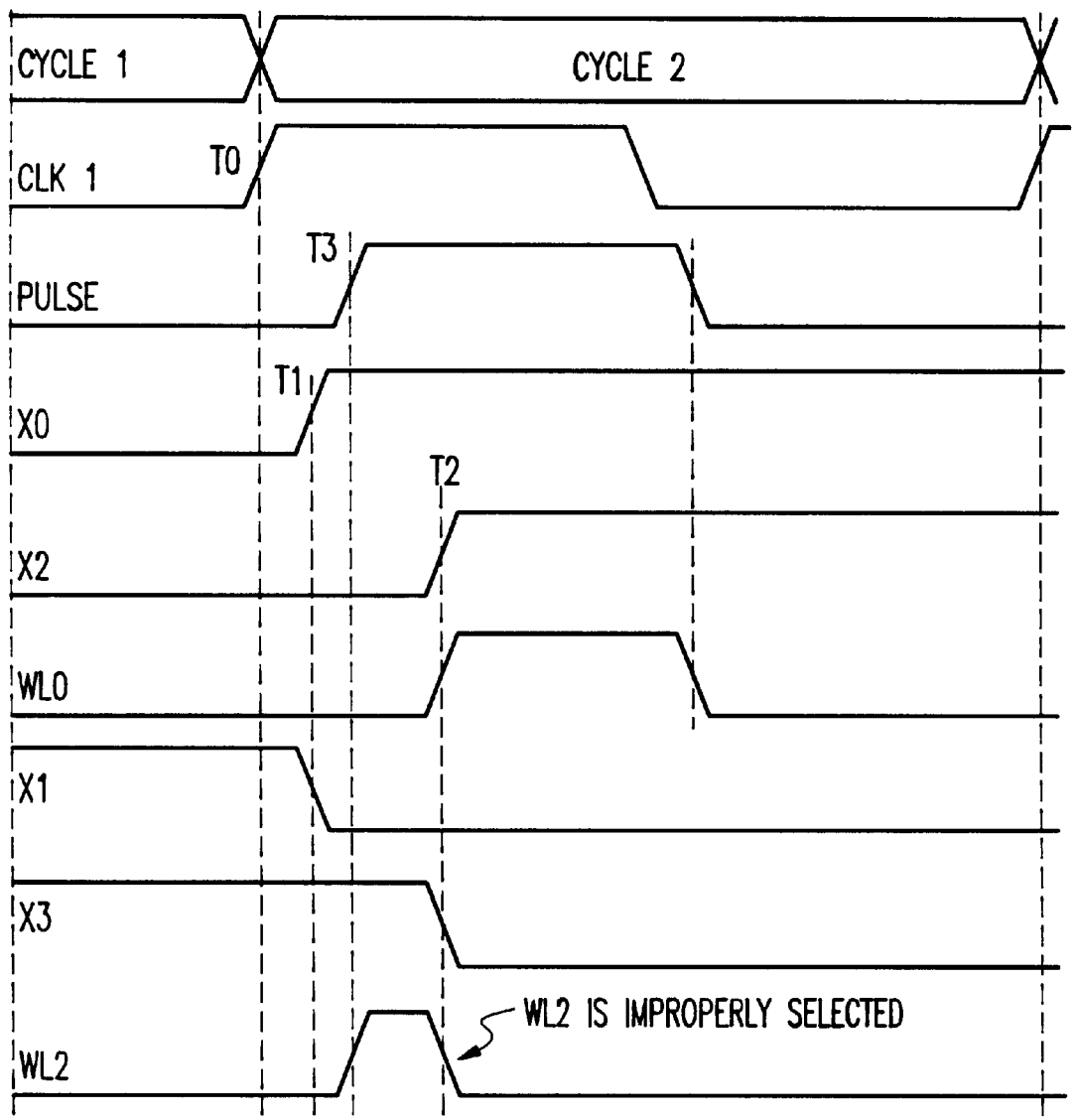
FIG. 4 is a timing chart showing abnormal timings of signals in the decoder 53 of FIG. 2.

Moreover, in the first embodiment, the single-chip memory system can be made smaller than the single-chip memory system 50 as shown in FIG. 1 because the single-chip memory system 60 according to the invention has no delay circuit 58 as shown in FIG. 1. Further, word line activating circuit 3 does not receive (or require) the signal PULSE as shown in FIG. 2. Additionally, register circuits 2 do not have an inverter 14 as shown in the conventional decoder 53 of FIG. 2.

Figure 8:
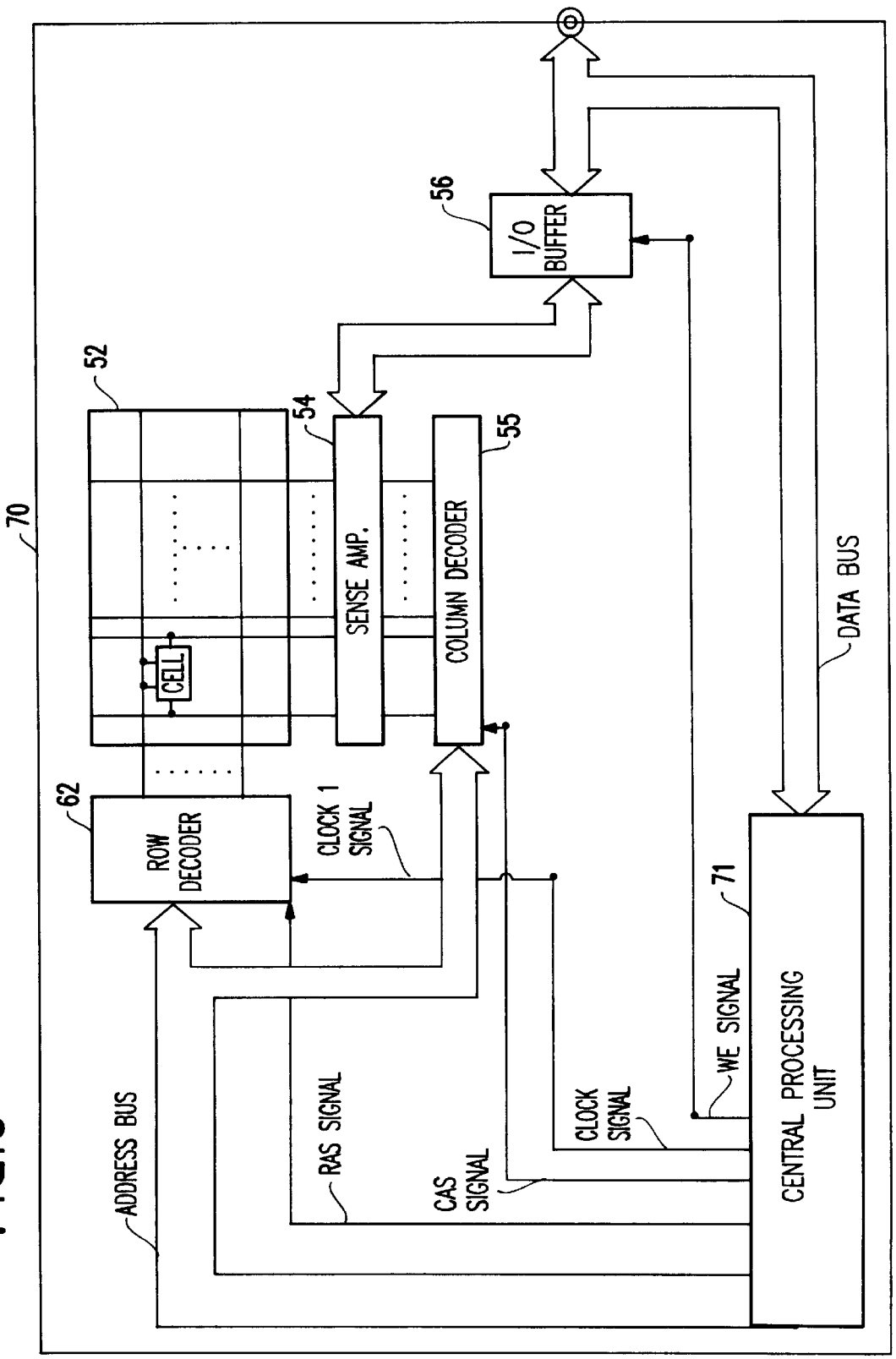
FIG. 8 is a diagram showing a memory system of a second embodiment according to the present invention.

In FIG. 5, the connection relationship between an external CPU 51 and the chip 60 is shown. As mentioned above, the chip 60 is operated by external CPU 51 because the chip 60 has no on-board CPU. However, the memory system may be modified to contain an on-board CPU 71, as shown in FIG. 8. In this case, all structure in the chip 60 (except for the terminals and delay circuit 57 which is made unnecessary) and CPU 71 are contained in a single semiconductor chip 70. As mentioned above, since the chip 70 of FIG. 8 contains CPU 71, the delay circuit 57 for synchronizing the internal clock signal CLK1 on the chip 60 with a bus cycle is unnecessary. It is noted that, with suitable modification, the row decoder 62 could receive a clock signal directly outputted by CPU 51 of FIG. 5. In such a case, the delay circuit 57 on the chip 60 also would become unnecessary.

As mentioned above, the exemplary array of SRAM cells 52 has four word lines, and therefore row decoder 62 has four register circuits 2. However, as known by one of ordinary skill in the art taking the present specification as a whole, the number of word lines and address signals, and thus the number of the above-mentioned structures, can be changed readily depending on the design of the memory system. Further, the logic (e.g., levels) of the signals shown in the timing chart of FIG. 7 is exemplary and may be suitably changed (e.g., reversed) depending on the designer's requirements and constraints.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A memory system comprising:
    an array of memory cells including a plurality of word lines;
    a terminal for receiving a clock signal and an address signal; and
    a decoder for receiving the address signal and for generating a decoded signal, said decoder including:
        register means for storing the decoded signal, for outputting a stored decoded signal in response to a first voltage level of the clock signal, and for stopping outputting of the stored decoded signal in response to a second voltage level of the clock signal; and
        activating means for activating a word line of said plurality of word lines based on an output of said register means,
    wherein said decoder activates one word line when the clock signal has the first voltage level, and forcibly inactivates all word lines when the clock signal has the second voltage level.

2. The memory system as recited in claim 1, wherein said register means comprises a plurality of storing circuits,
    wherein the storing circuits respectively correspond to a plurality of decoded signals, and each storing circuit of said plurality of storing circuits stores a voltage level of a corresponding signal of the decoded signals, outputs a stored voltage level in response to a first voltage level of the clock signal, and outputs a third voltage level in response to a second voltage level of the clock signal.

3. The memory system as recited in claim 2, wherein respective voltage levels of the corresponding signals of the decoded signals comprise one of a first voltage level and a second voltage level.

4. The memory system as recited in claim 3, wherein the third voltage level comprises a same voltage level as the second voltage level.

5. The memory system as recited in claim 4, wherein said activating means comprises a plurality of AND circuits,
    wherein said plurality of AND circuits respectively correspond to said plurality of word lines, and each AND circuit receives outputs of at least two of said storing circuits and activates a corresponding word line when each of the outputs includes the first voltage level.

6. The memory system as recited in claim 5, wherein each storing circuit of said plurality of storing circuits comprises:
    a first metal oxide semiconductor (MOS) transistor having a source-drain path between a first node for receiving a decoded signal and a second node;
    a first inverter for inverting an output of said second node;

a second inverter for inverting an output of a third node, said third node receiving an output of said first inverter;

a second MOS transistor having a source-drain path between said second node and an output of said second inverter;

a third MOS transistor having a source-drain path between said third node and a fourth node;

a third inverter for inverting an output of said fourth node and for outputting an inverted signal as an output signal of said each storing circuit; and a fourth MOS transistor having a source-drain path between said fourth node and a reference voltage, wherein gates of said first, second, third and fourth MOS transistors receive a signal corresponding to the clock signal.

7. The memory system as recited in claim 6, wherein said first and fourth MOS transistors comprise P-type transistors, and said second and third MOS transistors comprise N-type transistors.

8. The memory system as recited in claim 7, further comprising a delay circuit for receiving the clock signal and for outputting a delayed signal to said gates of said first, second, third and fourth MOS transistors.

9. The memory system as recited in claim 8, wherein the memory system is formed on a single semiconductor chip.

10. The memory system as recited in claim 9, wherein the memory system is operated by an off-chip central processing unit (CPU).

11. The memory system as recited in claim 7, said memory system for use with a central processing unit (CPU), wherein said gates of said first, second, third and fourth MOS transistors receive the clock signal directly from the CPU.

12. The memory system as recited in claim 11, wherein the memory system and said CPU are formed on a single semiconductor chip.

13. The memory system as recited in claim 1, wherein the memory system is formed on a single semiconductor chip.

14. The memory system as recited in claim 13, wherein the memory system is operated by an off-chip central processing unit (CPU).

15. The memory system as recited in claim 13, further comprising a central processing unit (CPU) formed on said single semiconductor chip.

16. A decoder comprising:

receiving means for receiving an address signal and for generating a decoded signal;

register means for storing the decoded signal, for outputting a stored decoded signal in response to a first voltage level of a clock signal and for stopping outputting of the stored decoded signal in response to a second voltage level of the clock signal; and activating means for activating a word line of a plurality of word lines based on an output of said register means, wherein said decoder activates one word line when the clock signal has the first voltage level, and forcibly inactivates all word lines when the clock signal has the second voltage level.

17. The decoder as recited in claim 16, wherein said register means comprises a plurality of storing circuits, wherein the storing circuits respectively correspond to a plurality of decoded signals, and each storing circuit of said plurality of storing circuits stores a voltage level of a corresponding signal of the decoded signals, outputs a stored voltage level in response to a first voltage level of the clock signal, and outputs a third voltage level in response to a second voltage level of the clock signal.

18. The decoder as recited in claim 17, wherein respective voltage levels of the corresponding signals of the decoded signals comprise one of a first voltage level and a second voltage level.

19. The decoder as recited in claim 18, wherein the third voltage level comprises a same voltage level as the second voltage level.

20. The decoder as recited in claim 19, wherein said activating means comprises a plurality of AND circuits, wherein said plurality of AND circuits respectively correspond to said plurality of word lines, and each AND circuit receives outputs of at least two of said storing circuits and activates a corresponding word line when each of the outputs includes the first voltage level.

21. The decoder as recited in claim 20, wherein each storing circuit of said plurality of storing circuits comprises:

a first metal oxide semiconductor (MOS) transistor having a source-drain path between a first node for receiving a decoded signal and a second node;

a first inverter for inverting an output of said second node;

a second inverter for inverting an output of a third node, said third node for receiving an output of said first inverter;

a second MOS transistor having a source-drain path between said second node and an output of said second inverter;

a third MOS transistor having a source-drain path between said third node and a fourth node;

a third inverter for inverting an output of said fourth node and for outputting an inverted signal as an output signal of said each storing circuit; and a fourth MOS transistor having a source-drain path between said fourth node and a reference voltage, wherein gates of said first, second, third and fourth MOS transistors receive a signal corresponding to the clock signal.

22. The decoder as recited in claim 21, wherein said first and fourth MOS transistors comprise P-type transistors, and said second and third MOS transistors comprise N-type transistors.

* * * * *